United States Patent [19]

Kammermeier et al.

[11] Patent Number: 5,716,170
[45] Date of Patent: Feb. 10, 1998

[54] DIAMOND COATED CUTTING MEMBER AND METHOD OF MAKING THE SAME

[75] Inventors: Dirk Kammermeier, Stein, Germany; Aharon Inspektor, Pittsburgh, Pa.; Wolfgang Borchert, Diefenheim, Germany

[73] Assignee: Kennametal Inc., Latrobe, Pa.

[21] Appl. No.: 648,603

[22] Filed: May 15, 1996

[51] Int. Cl.$^6$ .................................................. B23B 27/20
[52] U.S. Cl. .......................... 408/145; 407/119; 408/224; 76/108.6
[58] Field of Search ............................ 408/145, 144, 408/224, 223; 76/108.6, 108.1, 115; 407/118, 119

[56] References Cited

U.S. PATENT DOCUMENTS

| | | |
|---|---|---|
| Re. 34,180 | 2/1993 | Nemeth et al. ............... 428/547 |
| 4,282,289 | 8/1981 | Kullander et al. ............ 428/457 |
| 4,374,685 | 2/1983 | Suzuki et al. ................ 148/126.1 |
| 4,636,252 | 1/1987 | Yoshimura et al. ........... 75/238 |
| 4,643,620 | 2/1987 | Fujii et al. .................... 407/119 |
| 4,690,691 | 9/1987 | Komanduri .................... 51/293 |
| 4,731,296 | 3/1988 | Kikuchi et al. ................ 428/552 |
| 4,755,399 | 7/1988 | Fujii et al. .................... 427/277 |
| 4,762,445 | 8/1988 | Bunting et al. ................ 408/144 |
| 4,843,039 | 6/1989 | Akesson et al. ............... 501/87 |
| 4,966,501 | 10/1990 | Nomura et al. ................ 407/119 |
| 4,985,070 | 1/1991 | Kitamura et al. .............. 75/238 |
| 4,990,403 | 2/1991 | Ito ................................. 428/406 |
| 5,020,394 | 6/1991 | Nakamura et al. ............ 76/108 |
| 5,022,801 | 6/1991 | Anthony et al. ............... 408/144 |
| 5,028,451 | 7/1991 | Ito et al. ........................ 427/39 |
| 5,066,553 | 11/1991 | Yoshimura et al. ........... 428/698 |
| 5,068,148 | 11/1991 | Nakahara et al. ............. 428/335 |
| 5,071,294 | 12/1991 | Suzuki et al. .................. 408/145 |
| 5,096,736 | 3/1992 | Anthony et al. ............... 427/38 |
| 5,100,703 | 3/1992 | Saijo et al. .................... 427/249 |
| 5,123,217 | 6/1992 | Ishikawa et al. .............. 51/206 |

(List continued on next page.)

FOREIGN PATENT DOCUMENTS

| | | |
|---|---|---|
| 0337696 | 10/1989 | European Pat. Off. . |
| 0519587 | 12/1992 | European Pat. Off. . |
| 0374923 | 10/1995 | European Pat. Off. . |
| 644586 | 1/1985 | Japan . |
| 61-52363 | 3/1986 | Japan . |
| 61-124573 | 6/1986 | Japan . |
| 1270373 | 11/1986 | Japan . |
| 63-14869 | 1/1988 | Japan . |
| 63-45372 | 2/1988 | Japan . |
| 63-100182 | 5/1988 | Japan . |
| 63-199870 | 8/1988 | Japan . |
| 1103992 | 4/1989 | Japan . |
| 1201475 | 8/1989 | Japan . |

(List continued on next page.)

OTHER PUBLICATIONS

JIS B 0601 (1882) "Definitions and Designation of Surface Roughness", JIS Handbook 1989 Tools, Japanese Standards Association (1989), pp. 2245–2255.

ANSI B 46.1–1978, "Surface Texture" ASME (1978), pp. 1–37.

(List continued on next page.)

OTHER PUBLICATIONS

*Primary Examiner*—A. L. Pitts
*Assistant Examiner*—Henry W. H. Tsai
*Attorney, Agent, or Firm*—Stanislav Antolin

[57] ABSTRACT

A diamond coated elongate rotary cutting member and method of making the same. The cutting member includes an axially forward cutting surface, a flute and a fluted land. The cutting member comprises a substrate with hard grains bonded together with a metallic binder. The substrate has a first substrate region that presents an irregular surface so as to define the axially forward cutting surface and the fluted land. The first substrate region contains relatively large hard grains near the surface thereof that are larger in size than the hard grains in the interior of the substrate. A diamond coating is on the surface of the first substrate region. The substrate has a second substrate region that defines the flute.

18 Claims, 2 Drawing Sheets

U.S. PATENT DOCUMENTS

| | | | |
|---|---|---|---|
| 5,137,398 | 8/1992 | Omori et al. | 408/145 |
| 5,178,645 | 1/1993 | Nakamura et al. | 51/293 |
| 5,204,167 | 4/1993 | Saijo et al. | 428/212 |
| 5,273,557 | 12/1993 | Cerutti et al. | 51/293 |
| 5,326,195 | 7/1994 | Brox | 407/32 |
| 5,370,944 | 12/1994 | Omori et al. | 428/565 |
| 5,380,408 | 1/1995 | Svensson | 204/129.1 |
| 5,391,422 | 2/1995 | Omori et al. | 428/212 |
| 5,585,176 | 12/1996 | Grab et al. | 428/336 |

FOREIGN PATENT DOCUMENTS

| | | |
|---|---|---|
| 1246361 | 10/1989 | Japan . |
| 1255630 | 10/1989 | Japan . |
| 2170972 | 7/1990 | Japan . |
| 63322764 | 7/1990 | Japan . |
| 2217398 | 8/1990 | Japan . |
| 150534 | 9/1990 | Japan . |
| 2232105 | 9/1990 | Japan . |
| 948136 | 8/1995 | South Africa . |

OTHER PUBLICATIONS

"Surface Texture and Roundness Measurement Handbook", Sheffield Measurement Division, Warner L& Swasey (1988), pp. 47–48.

McCune et al., "An Auger Electronic Spectroscopy Study of the Surface of Ni–Mo Cemented Ti(CN) Substrates Used for Deposition of Crystalline Diamond Particles," Surface & Coatings Technology, 39/40 (1989), pp. 223–233.

75th Autumn Congress of the Light Metal Society, Nov. 1988, Katsumura et al., "Effect of Co Content in the Substrate Material and of the Surface State of the Substrate on the Performance of a Diamond–Coated Sintered Hard Alloy Tool in Cutting Al–18% Si Alloy", pp. 2–8.

Jindal et al., "Adhesion Measurements of Chemically Vapor Deposited and Physically Vapor Deposited Hard Coatings on WC–CO Substrates", Thin Solid Films 154 (1987) pp. 361–375.

Kikuchi et al., "Diamond Coated Inserts: Characteristics and Performance", Applications of Diamond Films and Related Materials, Ed. by Tzeng et al., (1991) pp. 61–68.

Murakawa et al., "Chemical Vapour Deposition o a Diamond Coating onto a Tungsten Carbide Tool Using Ethanol", Surface and Coatings Technology, 36 (1988), pp. 303–310.

Saito et al., "Adhesion Strength of Diamond Film on Cemented Carbide Insert", Diamond and Related Materials, 2 (1993), pp. 1391–1395.

Haubner et al., "Diamond Growth by Hot–Filament Chemical Vapor Deposition: State of the Art," Diamond and Related Materials, 2 (1993) pp. 1277–1294.

Yarbrough et al., "The Chemical Vapor Deposition of Diamond", Materials Science Forum, vols. 52 and 53 (1989), pp. 151–174.

Saijo et al., "The Improvement of the Adhesion Strength of Diamond Films", Surface and Coatings Technology, 43/44 (1990), pp. 30–40.

Lux et al., "Low Pressure Synthesis of Superhard Coatings", Intl. J. Ref. Met. & Hard Mater., 8 (1989), pp. 158–174.

Kuo et al., "Adhesion and Tribological Properties of Diamond Films on Various Substrates", J. Mater. Res., vol. 5, No. 11, Nov. 1990, pp. 2515–2523.

Söderberg et al., "Factors Influencing the Adhesion of Diamond Coatings on Cutting Tools", Vacuum, vol. 41, Nos. 4–6 (1990), pp. 1317–1321.

Park et al., "Behavior of Co Binder Phase during Diamond Deposition on WC–Co Substrate", Diamond and Related Materials, 2 (1993), pp. 910–917.

Saito et al., "Application of Diamond Films from $CO-H_2$ Plasma to Tool Blade Coating", Journal of Materials Science, 26, (1991), pp. 2937–2940.

Nesladek et al., "Improved Adhesion of CVD Diamond Films To Steel and Wc–Co Substrates", Diamond And Related Materials, 3 (1993), pp. 98–104.

"Metals Handbook Ninth Edition", vol. 7, Powder Metallurgy (1984), pp. 385–388, 398.

Tulhoff, "On the Grain Growth of WC in Cemented Carbides", Modern Developments in Powder Metallurgy, ed. by Hausner et al., vol. 14, Special Materials (1981), pp. 269–279.

Gaser, "Edge and Surface Honing on Various Shaped PCD & cBN Inserts", SME Technical Paper MR92–357 (1992).

Schneider, "Edge Grinding and Radiusing with Superabrasives", MAN, Sep. 1992, pp. 46–47.

Hosomi et al., "Diamond CVD Researches as Patent Applied", Applications of Diamond Films and Related Materials, ed. by Tzeng et al., Proceedings of Auburn University Conference, Aug. 1991, Elsevier Science Publishers B.V., (1991), pp. 15–24.

Israelsson, "A Progress Report on Cutting Tool materials", American Machinist, Dec. 1992, pp. 39, 40.

"Advanced Cutting Tool Materials", Kennametal Catalogue No. A90–67 (1988), pp. 1, 2, 77–86, 94–98, 101 and 102.

"Standard Test Method for Apparent Porosity in Cemented Carbides", ASTM Designation, B276–86.

"American National Standard for Cutting Tools—Indexable Inserts—Identification System", ANSI B212.4–1986.

Eastman et al., "Machining MMCs", Cutting Tool Engineering, Oct. 1993, pp. 38, 40–44.

Scheider, "Precision Edge Radius Grinding of Diamond Cutting Tools and Inserts", SME Technical Paper MR91–195 (1991).

Scheider, "New Abrasive Edge and Surface Preparation Tools, Techniques and Technology for Fabricated Material Applications", SME Technical Paper FC91–426 (1991).

Craig, Phillip, Senior Editor, "Thin–Film–Diamond Derby", Cutting Tool Engineering, vol. 44, No. 1, Feb. 1992, Reprinted by Crystallume Engineered Diamond Products (6 pages).

Mason, Frederick, "Diamond: the Material of the Future", American Machinist, Feb. 1990, pp. 43–46.

Crystallume Engineered Diamond Products Brochure, "Engineering CVD Diamond for Extraordinary Performance in Demanding Applications", (1991) (7 pages).

Yagi, Masaru, "Cutting Performance of Diamond Deposited Tool on Al–18 mass%Si Alloy", Science and Technology of New Diamond, edited by S. Saito, O. Fukunaga and M. Yoshikawa, pp. 399–404, copyright by KTK Scientific Publishers, Terra Scientific Publishing Company, 1990.

Shibuku, Kunio; Yagi, Masaru; Saijo, Kosuke; and Takatsu, Sokichi, "Adhesion Strength of Diamond Films on Cemented Carbide Substrates", Surface and Coatings Technology, 36 (1988) 295–302.

M. Yagi et al., "Cutting Performance of Diamond Cutting Tool for Al–18 mass% Si Alloy", Journal of Japan, Institute of Light Metals, vol. 39, No. 6, pp. 417–422 (1989) (Trans. and Orig. Japanese).

Katsumura et al., "The Effects of Cobalt Content and Surface State of Substrate on Cutting Performance of Diamond Deposited Cemented Carbide Tool for Al–18% Si Alloy", Journal of Japan, Institute of Light Metals, vol. 39, No. 9, pp. 634–638 (1989) (Trans. and Orig. Japanese).

Saijo et al., "The Tool Life of Diamond Coatings in Milling an Al–Si Alloy, Applications of Diamond Films and Related Materials", ed. by Tzeng et al., Elsevier Sci. Pub. B.V. (1991), pp. 69–76.

Suzuki et al., "Diamond Deposition on WC–Co Cemented Carbide by Hot Filament Method", J. Jpn. Soc. Powder Metall., 33 (5) (1986) (English translation and Japanese language copy (pp. 38–45).

DIAMOND COATED CUTTING MEMBER AND METHOD OF MAKING THE SAME

BACKGROUND

The invention pertains to an improved diamond coated elongate cutting member and a method of making the same. More specifically, the invention pertains to a diamond coated elongate rotary cutting member such as, for example, a drill, an endmill or reamer, wherein the diamond coating has improved adherence on selected cutting surfaces of the cutting member, and a method of making the same.

In the past, there have been diamond coated elongate rotary cutting members, such as, for example, drills. In this regard, U.S. Pat. No. 5,022,801 for CVD DIAMOND COATED TWIST DRILLS to Anthony et al. discloses a diamond coated twist drill in which the substrate includes slots that fill with diamond during a chemical vapor deposition (CVD) diamond coating process. The Anthony et al. patent does not express a concern that the diamond coating remain over most areas of the drill, but only that it remain on the cutting edge thereof. The slots function as wear stops, as well as additional cutting edges upon the wearing away of adjacent material.

U.S. Pat. No. 5,370,944 for DIAMOND-COATED HARD MATERIAL AND A PROCESS FOR THE PRODUCTION THEREOF to Omori et al. discloses, in accordance with Example 4 thereof, different processes for making a twist drill wherein the substrate undergoes a heat treatment prior to the diamond coating. In one process, the substrate was heat treated in a nitrogen atmosphere at 1350° C. and 100 torr for 60 minutes prior to diamond coating. In a second process, the substrate was heat treated in a CO atmosphere at 1350° C. and 100 torr for 60 minutes prior to diamond coating. In still another process, the substrate was heat treated in a nitrogen atmosphere at 1300° C. and 100 atmospheres for 60 minutes prior to diamond coating. In another process, the substrate was heat treated in a nitrogen atmosphere at 1300° C. and 100 atmospheres for 60 minutes prior to diamond coating; and then after the coating process, the diamond coating was partly ground to a specified surface roughness. For all of these examples, the diamond coating process was a microwave plasma CVD process.

Other patents concern an elongate rotary cutting member, such as a drill, with diamond or other hard inserts therein. For example, U.S. Pat. No. 4,762,445 for a COMPOSITE SINTERED TWIST DRILL to Bunting et al. shows offset, opposed inserts of diamond that are embedded within the drill blank. U.S. Pat. No. 5,273,557 for TWIST DILLS HAVING THERMALLY STABLE DIAMOND OR CBN COMPACTS TIPS to Cerutti et al. concerns a rotary drill bit with a slot in which there is a diamond compact held therein by a braze alloy with a liquidus greater than 700 ° C. U.S. Pat. No. 5,137,398 for a DRILL BIT HAVING A DIAMOND-COATED SINTERED BODY to Omori et al. shows a twist drill with a detachable insert received in a slot in the axially forward end of the drill body. U.S. Pat. No. 5,123,217 for a DRILL FOR USE IN DRILLING HARD AND BRITTLE MATERIALS to Ishikawa et al. shows a drill with a cutting head presenting a hard insert. U.S. Pat. No. 5,071,294 for a BURNISHING DRILL to Suzuki et al. shows a drill that uses diamond chips mounted in recessed grooves. U.S. Pat. No. 5,020,394 for a POLYCRYSTAL DIAMOND FLUTED TOOL AND A PROCESS FOR THE PRODUCTION OF THE SAME to Nakamura et al. shows a drill with a diamond coating on selected areas of the drill.

None of the above methods appears to address the objective of maintaining dimensional tolerances of a substrate during the resintering process (prior to the diamond coating process) so that the diamond-coated substrate retains it dimensional tolerances throughout the diamond coating process. As can be appreciated, it is important that a diamond coated rotary cutting member maintains its tolerances, i.e., dimensional integrity.

It would thus be very desirable to provide an improved diamond coated elongate rotary cutting member such as, for example, a drill, an endmill, a tap, a burr, a countersink, or reamer, and a method of making the same.

It also would be highly desirable to provide an improved diamond coated elongate rotary cutting member such as, for example, a drill, an endmill, a tap, a burr, a countersink, or reamer, and a method of making the same, wherein the diamond coated rotary cutting member would have dimensional integrity as well as good adherence of the diamond coating thereto.

SUMMARY

It is an object of the invention to provide an improved diamond coated elongate rotary cutting member, and a method of making the same.

It is another object of the invention to provide an improved diamond coated elongate rotary cutting member that has good adherence of the diamond coating thereto, and a method of making the same.

It is another object of the invention to provide an improved diamond coated elongate rotary cutting member that has good adherence of the diamond coating thereto and dimensional integrity, and a method of making the same.

In one form thereof, the invention is a diamond coated elongate rotary cutting member that includes an axially forward cutting surface, a flute and a fluted land. The cutting member comprises a substrate which includes hard grains bonded together with a metallic binder. The substrate has a first substrate region that presents a surface and defines the axially forward cutting surface and the fluted land. The first substrate region contains relatively large hard grains near the surface thereof where the relatively large hard grains are larger in size than the hard grains in the interior of the substrate. The first substrate region presents an irregular surface. A diamond coating is on the surface of the first substrate region. The substrate has a second substrate region that defines the flute.

In another form thereof, the invention is a diamond coated rotary cutting member which includes a critical impingement surface and a non-critical impingement surface. The cutting member comprises a substrate, which includes hard grains bonded together with a metallic binder, that has a first substrate region that defines the critical impingement surface. The first substrate region contains relatively large hard grains near the critical impingement surface which are larger in size than the hard grains in the interior of the substrate. The critical impingement surface presents an irregular surface. The substrate has a second substrate region that defines the non-critical impingement surface. The second substrate region contains hard grains that have a size about the same as the hard grains in the interior of the substrate. The non-critical impingement surface has a surface roughness less than the surface roughness of the first substrate region. A diamond coating is on the critical impingement surface.

In still another form thereof, the invention is a method of making a diamond coated rotary cutting member wherein the cutting member includes a critical impingement surface and a non-critical impingement surface. The method comprises the steps of: providing a sintered substrate that includes hard grains bonded together by a metallic binder; then removing material from the substrate so as to form a first substrate region that presents the critical impingement surface; then resintering the substrate for a time and temperature and in an atmosphere so as to produce grain growth at the surface of the substrate; then removing material from the substrate so as to form a second substrate region that presents the non-critical impingement surface; and adherently depositing a diamond coating on the substrate wherein the adherence of the diamond coating to the critical impingement surface is greater than the adherence of the diamond coating to the non-critical impingement surface.

In still another form thereof, the invention is a method of making a diamond coated rotary cutting member wherein the cutting member includes a critical impingement surface and a non-critical impingement surface. The method comprises the steps of: providing a sintered substrate that includes hard grains bonded together by a metallic binder; then removing material from the substrate so as to form a first substrate region that presents the critical impingement surface; then resintering the substrate for a time and temperature and in an atmosphere so as to produce grain growth at the surface of the substrate; adherently depositing a diamond coating on the substrate; and then removing material from the diamond-coated substrate so as to form a second substrate region that presents the non-critical impingement surface wherein the critical impingement surface has a diamond coating thereon and there is an absence of diamond coating on the non-critical impingement surface.

BRIEF DESCRIPTION OF THE DRAWINGS

The following is a brief description of the drawings which form a part of this patent application.

DETAILED DESCRIPTION

Figure 1:
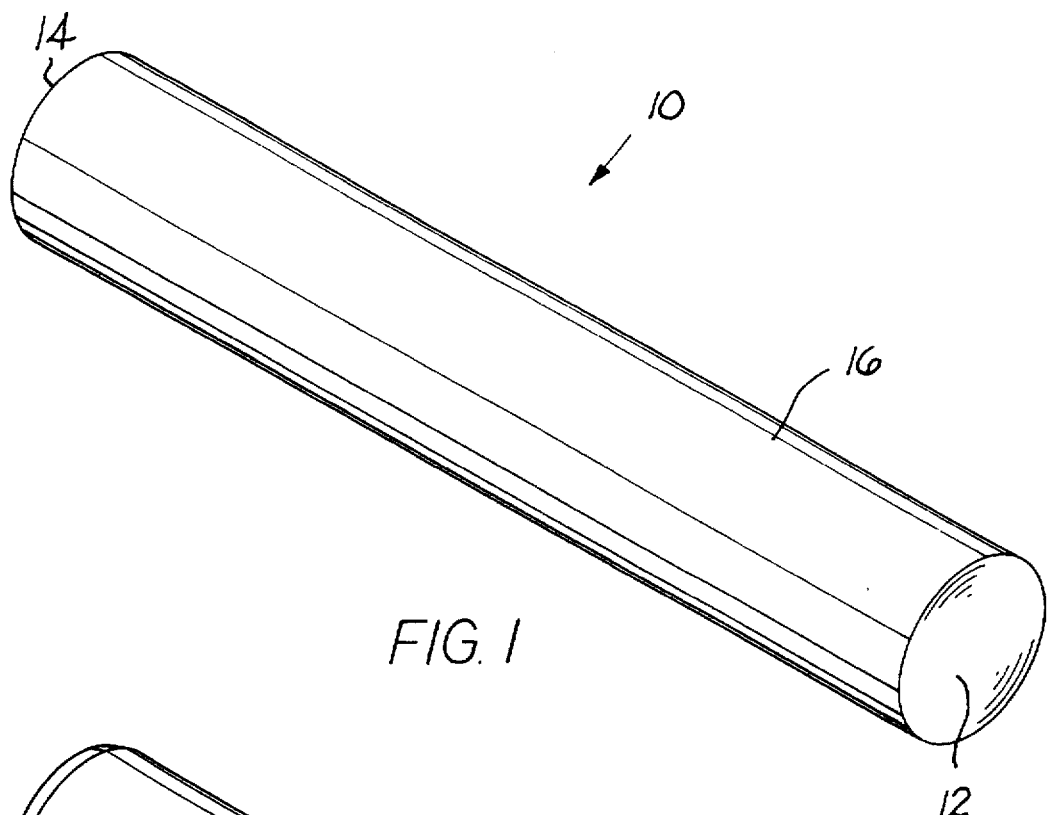
FIG. 1 is a perspective view of a sintered blank for a twist drill.

Referring to the drawings, FIG. 1 illustrates a generally cylindrical sintered substrate blank, generally designated as 10, for a twist drill, i.e., an elongate rotary cutting member. It should be appreciated that while the specific embodiment is a twist drill, the invention may encompass other rotary cutting members. For example, each one of a tap, a burr, a countersink, a reamer, or an endmill is a cutting member that is within the scope of the invention.

As will become apparent from the description hereinafter, the embodiment of the invention that includes the removal of materials as the last processing step has particularly good application to the manufacture of bodies with complex geometries. More specifically, because the last step comprises the removal of material through machining or the like, this process maintains the dimensional integrity and dimensional tolerances necessary in the production of a body with a complex geometry or shape.

Referring back to FIG. 1, substrate 10 has opposite axially forward and rearward ends 12 and 14, respectively. Substrate 10 presents a generally cylindrical surface 16 along the entire length thereof so that the overall geometry of substrate 10 is cylindrical.

A typical material for the substrate 10 is tungsten carbide cemented with cobalt. Other typical materials include tungsten carbide-based material with other carbides (e.g. TaC, NbC, TiC, VC) present as simple carbides or in solid solution. The amount of cobalt can range between about 0.2 weight percent and about 20 weight percent, although the more typical range is between about 5 weight percent and about 16 weight percent. Typical tungsten carbide-cobalt (or tungsten carbide-based/cobalt) compositions used for a twist drill or other elongate cutter member (e.g., an endmill or a reamer) include the following compositions and their properties.

Composition No. 1 comprises between about 11.0 and about 12.0 weight percent cobalt, between about 1.2 and about 2.6 weight percent tantalum and between about 0.2 and about 0.6 weight percent niobium in the form of Ta(Nb)C, no greater than about 0.4 titanium in the form of TiC and the balance tungsten carbide. For Composition No. 1, the average grain size of the tungsten carbide is between about 1 and about 6 micrometers ($\mu m$), the porosity is about A06, B00, C00(per ASTM Designation B 276-86), the density is between about 14,000 and about 14,400 kilograms per cubic meter ($kg/m^3$), the Rockwell A hardness is between about 89.4 and about 90.2, the magnetic saturation is between about 88 and 98 percent wherein 100 percent is equal to about 202 microtesla cubic meter per kilogram-cobalt ($\mu Tm^3/kg$) (about 160 gauss cubic centimeter per gram-cobalt (gauss-$cm^3$/gm)), the coercive force is between about 135 and about 185 oersteds, and the transverse rupture strength is about 2.8 gigapascal (GPa).

Composition No. 2 comprises between about 10.0 and about 10.6 weight percent cobalt, between about 4.7 and about 5.7 weight percent tantalum and between about 3.0 and about 3.8 weight percent niobium in the form of Ta(Nb)C, between about 3.0 and about 3.8 weight percent titanium in the form of TiC and the balance tungsten carbide. For Composition No. 2, the average grain size of the tungsten carbide is between about 1 and about 6 $\mu m$, the porosity is A06, B00, C00 (per the ASTM Designation B 276-86 entitled "Standard Test Method for Apparent Porosity in Cemented Carbides"), the density is between about 12,700 and about 13,100 $kg/m^3$, the Rockwell A hardness is between about 90.7 and about 91.3, the magnetic saturation is between about 80 percent and about 100 percent, the coercive force is between about 140 and about 180 oersteds, and the transverse rupture strength is about 2.4 GPa.

Composition No. 3 comprises about 8.5 weight percent cobalt and the balance tungsten carbide. For Composition No. 3, the average grain size of the tungsten carbide is about 2.5 $\mu m$, the density is between about 14,600 and about 14,800 $kg/m^3$, the Vickers hardness is between about 1370 and about 1430 HV30, the magnetic saturation is between about 79.2 and about 94.4 percent, the coercive force is between about 130 and about 170 oersteds, and the transverse rupture strength is about 3.0 GPa.

Composition No. 4 comprises about 11.5 weight percent cobalt and the balance tungsten carbide. For Composition No. 4, the average grain size of the tungsten carbide is between about 1 and about 4 $\mu m$, the density is between about 12,690 and about 12,890 kg/m$^3$, the Vickers hardness is between about 1300 and about 1400 HV30, the magnetic saturation is between about 79.2 and about 93.8 percent, the coercive force is between about 110 and about 170 oersteds, and the transverse rupture strength is about 2.25 GPa.

Composition No. 5 comprises about 6.0 weight percent cobalt, 1.6 weight percent Ta(Nb)C, and the balance tungsten carbide. For Composition No. 5, the average grain size of the tungsten carbide is about 1 µm, the density is between about 14,800 and about 14,900 kg/m$^3$, the Vickers hardness is between about 1640 and about 1740 HV30, the magnetic saturation is between about 79.2 and about 94.0 percent, the coercive force is between about 210 and about 270 oersteds, and the transverse rupture strength is about 2.6 GPa.

Composition No. 6 comprises between about 14.7 and about 15.3 weight percent cobalt, no greater than about 0.1 weight percent tantalum and about 0.1 weight percent niobium in the form of Ta(Nb)C, no greater than about 0.1 titanium in the form of TiC, between about 0.2 and about 0.4 weight percent vanadium in the form of vanadium carbide and the balance tungsten carbide. For Composition No. 6, the average grain size of the tungsten carbide is less than about 1 µm, the porosity is A06, B01, C00 (per ASTM Designation B 276-86), the density is between about 13,800 and about 14,000 kg/m$^3$, the Rockwell A hardness is between about 91.0 and about 91.8, the magnetic saturation is between about 80 and about 88 percent, the coercive force is between about 280 and about 320 oersteds, and the transverse rupture strength is about 3.5 GPa.

Composition No. 7 comprises between about 9.7 and about 10.3 weight percent cobalt, no greater than about 0.1 weight percent tantalum and about 0.1 weight percent niobium in the form of Ta(Nb)C, no greater than about 0.1 titanium in the form of TiC, between about 0.1 and about 0.3 weight percent vanadium in the form of vanadium carbide and the balance tungsten carbide. For Composition No. 7, the average grain size of the tungsten carbide is less than about 1 µm, the porosity is about A06, B01, C00 (per ASTM Designation B 276-86), the density is between about 14,400 and about 14,600 kg/m$^3$, the Rockwell A hardness is between about 91.5 and about 92.9, the magnetic saturation is between about 80 and about 98 percent, the coercive force is between about 250 and about 350 oersteds, and the transverse rupture strength is about 3.1 GPa.

Composition No. 8 comprises about 9.5 weight percent cobalt and the balance tungsten carbide. For Composition No. 8, the average grain size of the tungsten carbide is about 0.8 µm, the density is between about 14,500 and about 14,600 kg/m$^3$, the Vickers hardness is between about 1520 and about 1580 HV30, the magnetic saturation is between about 79.2 and about 93.8 percent, the coercive force is between about 225 and about 265 oersteds, and the transverse rupture strength is about 3.6 GPa.

Composition No. 9 comprises between about 8.6 and about 9.4 weight percent cobalt, between about 0.3 and about 0.5 weight percent tantalum and no greater than about 0.2 weight percent niobium in the form of Ta(Nb)C, no greater than about 0.4 titanium in the form of TiC and the balance tungsten carbide. For Composition No. 9, the average grain size of the tungsten carbide is between about 1 and about 10 µm, the density is between about 14,300 and about 14,600 kg/m$^3$, the Rockwell A hardness is between about 88.9 and about 90.1, the magnetic saturation is between about 88 and 98 percent, the coercive force is between about 100 and about 160 oersteds, and the transverse rupture strength is about 2.4 GPa.

Composition No. 10 comprises about 11.0 weight percent cobalt, 8.0 weight percent Ta(Nb)C, 4.0 weight percent TiC and the balance tungsten carbide. For Composition No. 10, the average grain size of the tungsten carbide is between about 1 and about 8 µm, the density is between about 12,950 and about 13,150 kg/m$^3$, the Vickers hardness is between about 1330 and about 1430 HV30, the magnetic saturation is between about 79.2 and about 93.6 percent, the coercive force is between about 155 and about 185 oersteds, and the transverse rupture strength is about 2.5 GPa.

It should be appreciated that other binder materials may be appropriate for use. In addition to cobalt and cobalt alloys, suitable metallic binders include nickel, nickel alloys, iron, iron alloys, and any combination of the above materials (i.e., cobalt, cobalt alloys, nickel, nickel alloys, iron, and/or iron alloys).

The first step in the processing of the substrate 10 is to grind the surface of the basic elongate substrate. The substrate 10 depicted in FIG. 1 has already had the surface thereof subjected to grinding.

Figure 2:
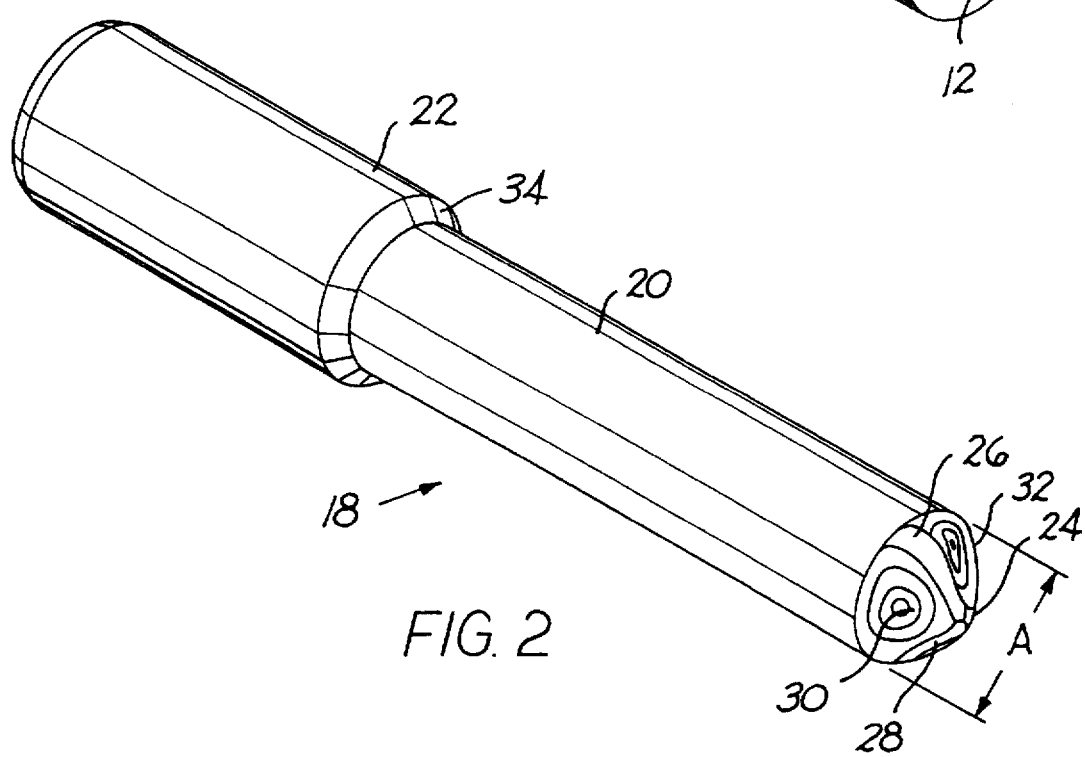
FIG. 2 is a perspective view of the sintered blank of FIG. 1 with material ground therefrom so as to define the outside diameter of the fluted portion and a part of the axially forward cutting surface of the twist drill.

The second basic step is to remove material from selected portions of the generally cylindrical substrate 10. FIG. 2 illustrates the substrate after it has been ground so as to remove a selected volume of the material from the axially forward portion thereof. For the sake of differentiation between the structure of FIG. 2 and the substrate blank 10, the substrate in the condition illustrated in FIG. 2 is generally designated as 18.

Through infeed grinding a volume of material is removed from the axially forward portion of the substrate so as to define the outside diameter "A" of the smaller diameter (i.e., the cutting diameter) part 20 of the substrate that will become the fluted section of the twist drill. This step does not remove material from the rearward portion of the substrate wherein the rearward portion defines a larger-diameter part 22 of the substrate that will become the shank of the twist drill.

This processing step also grinds (or removes) material from the axially forward portion of the substrate so as to define a part of the axially forward cutting surface. More specifically, this step defines the cutting edge 24 and the flank surfaces 26 and 28 of the twist drill. Surfaces 30 and 32 are also exposed as a result of this processing step that forms the cutting edge.

Finally, this step removes material to chamfer the rearward end of the substrate, and to form the shoulder 34 between the reduced diameter portion and the enlarged diameter portion of the substrate.

Figure 3:
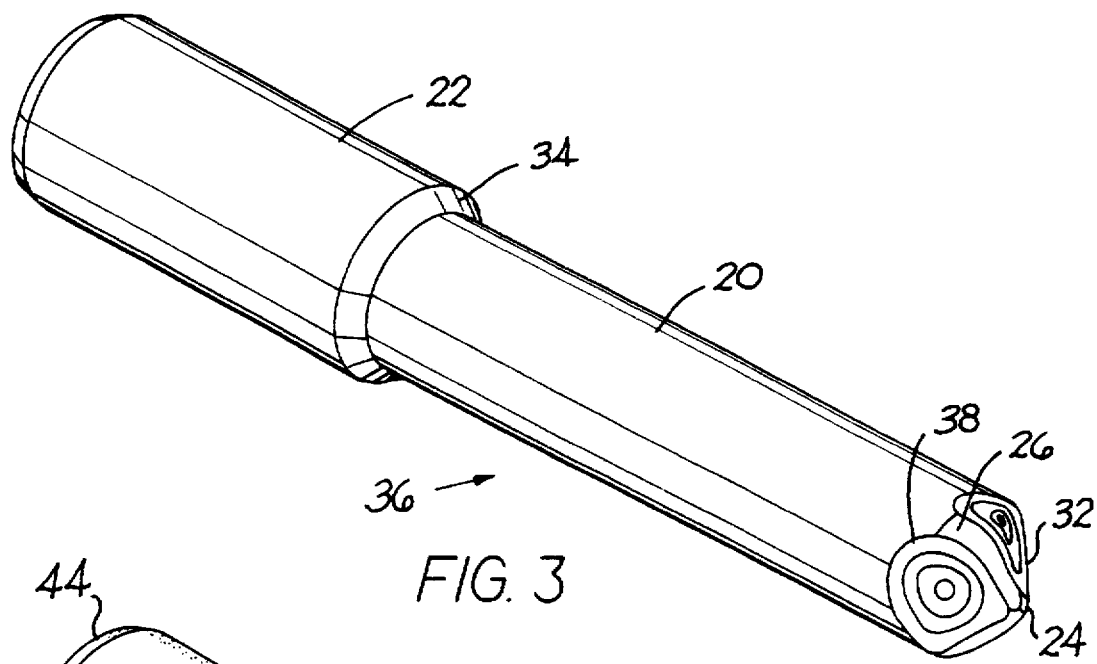
FIG. 3 is a perspective view of the sintered blank of FIG. 2 with material ground therefrom so as to define the remainder of the axially forward cutting surface of the twist drill.

The next step in the processing of the elongate structure 18 is to remove material from the axially forward end thereof so as to produce the structure illustrated by FIG. 3. For the sake of differentiation between the structure of FIG. 3, and the substrate generally designated as 18, the substrate of FIG. 3 is generally designated as 36. The removal of the material through this second grinding step defines the short flutes the twist drill. FIG. 3 illustrates only one short flute 38.

The above description characterizes the processing to arrive at the structure of FIG. 3 a certain number of basic steps. However, it should be appreciated that the processing may take any number of suitable steps. The use of the above-described basic steps is for ease of description. Thus, the scope of the invention is not limited to the specific processing steps set forth above.

It is at this stage of the processing that the substrate, which is in the condition illustrated by FIG. 3, is subjected to a resintering process. When in the condition depicted by FIG.

3, the substrate 36 has sufficient mass (or dimensional simplicity) to withstand unwanted dimensional deformation due to the resintering, i.e., heat treating, process that takes place at a temperature above the liquidus of the material. Thus, as a result of the resintering process, the dimensional tolerances present in the substrate as depicted in FIG. 3 will not change so that the structure which has been ground to a desired dimension will maintain its dimensional integrity, i.e., during the resintering process, the structure will experience no dimensional deformation, or if the structure experiences dimensional deformation, the deformation is such that the final structure remains within the preselected dimensional tolerances. In other words, the cutting edges, the flank surfaces, the short flutes, and the outside diameter of the fluted section (which will become the fluted lands) will keep their dimensional integrity after the resintering process.

Referring to the resintering process, it must first be understood that in the case of a WC-based/Co alloy the surface of the sintered substrate comprises hard grains of tungsten carbide (either as a simple carbide or in solid solution with other carbides) bound together by cobalt or a cobalt alloy. The cobalt is not only between the tungsten carbide grains, but also covers some the tungsten carbide grains at the surface of the as-sintered substrate due to the wetting properties of cobalt and tungsten carbide under vacuum sintering conditions. In addition, the areas of the substrate which have been ground will tend to have cobalt smeared over the surface of the substrate so as to cover the tungsten carbide grains.

The resintering process occurs at an appropriate time, temperature and atmospheric conditions so as to cause tungsten carbide grain growth at the surface of the substrate, as well as cobalt depletion (or evaporation) therefrom. The result is the production of a substrate surface with a surface roughness of greater than 25 microinches, $R_a$, and preferably greater than 30 microinches, $R_a$, and more preferably greater than 40 microinches, $R_a$.

Although the below discussion pertains to what is identified as Alloy B in published International Patent Application No. PCT/US94/02346 (International Publication No. WO95/15258) DIAMOND COATED TOOLS AND METHOD FOR MAKING and assigned to Kennametal Inc. of Latrobe, Pennsylvania [this International Patent Application No. PCT/US94/02346 (International Publication No. WO95/15258) is hereby incorporated by reference herein], it is expected that the same or similar results would occur for typical compositions used for elongate cutting members such as, for example, twist drills. More specifically, these results should occur for the substrates identified above as typical substrates for a drill or reamer.

Alloy B had the following composition: 2.3 to 2.9 weight percent cobalt, up to 0.4 weight percent tantalum, up to 0.1 weight percent niobium, other impurities and the balance tungsten carbide. Alloy B had the following properties: Rockwell A hardness of between 92.8 and 93.6; coercive force ($H_c$) of between 290 and 440 oersteds; magnetic saturation sufficient to avoid the formation of eta phase, the average tungsten carbide grain size was 1–6 µm, the porosity rating was A08, B00, C00 or better, and a density of between 15.10 and 15.50 grams/cm².

The resintering process for Alloy B was done at 2750° F. (1510° C.) for three hours in a 66.5 Pa (0.5 torr) nitrogen atmosphere. As can be appreciated, the times to achieve a certain surface roughness can vary. It is typically the case that sintering times decrease with an increase in the sintering temperature. The preferred atmosphere is nitrogen wherein the partial pressure allows for cobalt evaporation while minimizing the rewetting of the tungsten carbide with the cobalt in the bulk substrate. The formation of a nitride layer on the surface should also be avoided. The range of the nitrogen partial pressure ranges between 39.9 Pa (0.3 torr) to 6.650 Pa (50 torr) with a preferable range being 39.9 Pa (0.3 torr) to 665 Pa (5 torr), and a most preferable range being between 39.9 Pa (0.3 torr) and 266 Pa (2 torr).

After resintering, the microstructure of the Alloy B changed in the following ways. The cobalt content was reduced, as was the existence of cobalt pools, in the peripheral surface zone. The cobalt content decreased about 0.5 weight percent throughout the sample including the peripheral surface zone.

The porosity rating was improved in the peripheral surface zone. In this regard, the porosity was A02 and A06 with no interconnected porosity in the peripheral surface zone, as well as any where else in the sample.

The grain size of the tungsten carbide increased. More specifically, the tungsten carbide grain size was non-uniform and ranged between 1–11 µm. The larger grains and frequency of larger grains was higher in the peripheral surface zone which contained grains as large as 16 µm to 28 µm.

The surface roughness of Alloy B is shown in Table II of published International Patent Application No. PCT/US94/02346 (International Publication No. WO95/15258) DIAMOND COATED TOOLS AND METHOD FOR MAKING assigned to Kennametal Inc. of Latrobe, Pa. Table II shows that the surface roughness varies between about 38 microinches, $R_a$, and about 68 microinches, $R_a$.

Applicant expects that the above changes; namely, grain growth near the surface and binder metal reduction near the surface, will occur upon sintering any of the specific alloys identified earlier in this patent application. Thus, any of these alloys should present a suitable surface roughness to enhance the adherence of the diamond coating thereto.

Figure 4A:
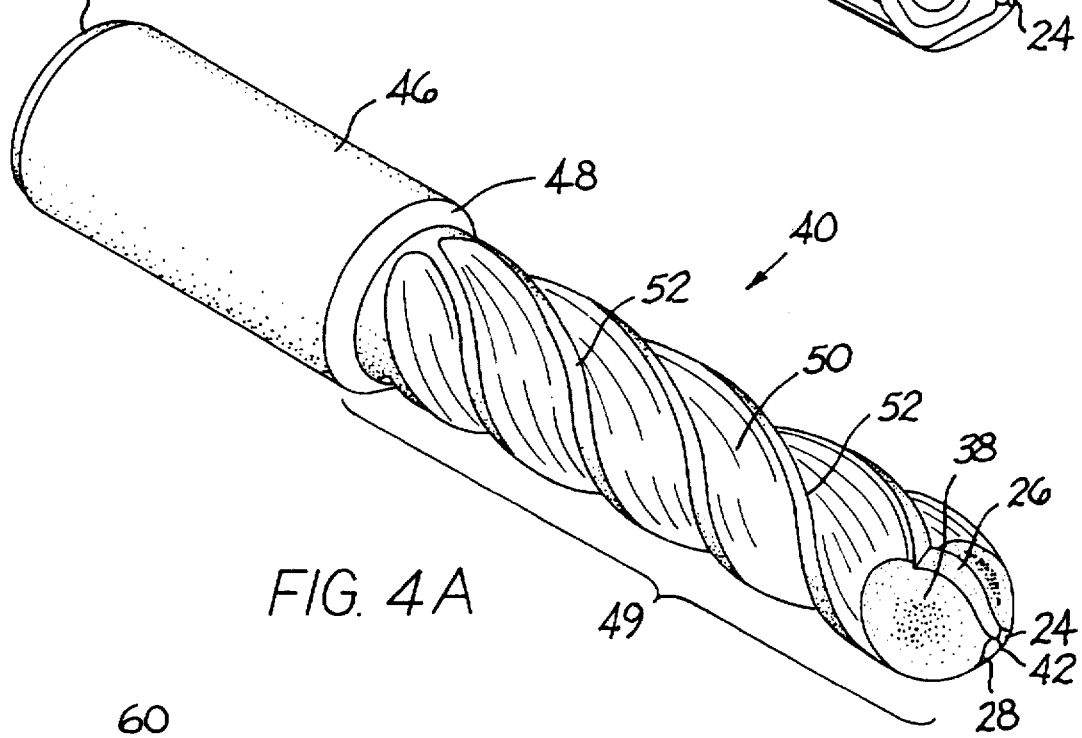
FIG. 4A is a perspective view of the structure of FIG. 3 after resintering and with material ground therefrom so as to define the flutes of the twist drill.

The next step in the processing of the substrate 36 is to remove material so as to define a fluted section with the helical flutes contained therein. The resultant structure is illustrated in FIG. 4A, and is generally designated as 40. Substrate 40 has opposite axially forward and rearward ends 42 and 44, respectively. A shank 46 is adjacent to the axially rearward end 44 of the drill 40. The substrate 40 further includes a fluted section 49 which contains the flutes 50 of the drill. The fluted section 49 extends from the shoulder 48 of the drill to the axially forward end 42. Fluted lands 52 are between the adjacent flutes 50. FIG. 4A illustrates that the axially forward portion of the substrate includes the cutting edge 24, the flank surfaces 26 and 28, and the faces wherein FIG. 4A illustrates only one short flute 38.

The surface roughness of the twist drill substrate varies depending upon the specific area or region thereof. The fluted lands 52, the cutting edge 24, the flanks (26, 28) and the short flutes 38 define the first substrate region. The surface roughness of the first substrate region is at least 25 microinches, $R_a$, preferably at least 35 microinches, $R_a$, and most preferably at least 40 microinches, $R_a$.

The first substrate region presents a surface area that is the critical impingement surface. In other words, these structures; namely, the fluted lands, the cutting edges, the flanks and the short flutes present surface area to which it is critical that the diamond coating have the best adherence. This is because these surface areas are important to the satisfactory cutting operation. Although not a part of the first substrate region, the surfaces of the shank 46 and the shoulder 48 also have the above surface roughness parameters.

The balance of the surface of the twist drill substrate 40 define a second substrate region. More specifically, the flutes 50 define the second substrate region. The microstructure that presents larger hard grains and reduced binder metal content has been ground off (removed) to make the flutes so that the second substrate region has a surface roughness that is less than that of the first substrate region.

The second substrate region presents a surface area to which it is not critical that the diamond coating have good adherence. This is because the surfaces of the flutes do not have a great impact on the satisfactory cutting by the drill. It therefore becomes apparent that it is more important that the diamond coating have good adherence to the surface areas of the first substrate region (i.e., the critical impingement surfaces) than to the surface areas of the second substrate region (i.e., the non-critical impingement surfaces).

The substrate 40 is now in a condition in which it can be diamond coated. As an alternative processing step prior to coating, selected surfaces of the substrate 40 can be diamond scratched so as to increase the diamond nucleation sites. Diamond scratching would typically occur in areas of the first substrate region. The diamond scratching may be performed by hand scratching the area with a 0.25 μm diamond paste or by sonicating in a slurry of 0.5 μm to 3 μm diamond powder in 100 ml of acetone. The process of sonicating comprises forming a slurry of diamond powder and acetone, ultrasonically vibrating the slurry, and then submerging the item in the vibrating slurry so that the diamond particles impinge the surface of the item.

Applicants also contemplate that as an alternate processing step prior to the diamond coating, the cobalt may be removed from selected surfaces of the substrate by mechanical, chemical or electrochemical processes. It is preferable to remove the cobalt from the second substrate region (which presents the non-critical impingement surfaces) so as to enhance the adherence of the diamond coating to this area of the substrate. U.S. Pat. No. 5,380,408 to Svensson for an ETCHING PROCESS discloses an electrochemical etching process in a mixture of sulfuric acid, phosphoric acid, and water so as to remove the binder phase from the surface of a hard material. European Patent No. 0 337 696 for a SURFACE-COATED CEMENTED CARBIDE AND A PROCESS FOR THE PRODUCTION OF THE SAME mentions the use of mechanical processes (barrel, brushing, or the like), chemical processes (leaching in acids such as nitric, hydrochloric, hydrofluoric, sulfuric, or the like), or electrochemical processes to remove binder from the surface region of a substrate. Japanese Published Patent Application No. 2-217398 (published on Aug. 30, 1990) for a COATING METHOD BY DIAMOND THIN FILM discloses an electrolytic grinding method to remove binder from the surface of a substrate.

In regard to the diamond coating, it may be performed by a vapor deposition technique such as, for example, hot filament, DC plasma jet, microwave plasma, or arc jet techniques. A suitable technique to apply the diamond coating is set forth in published International Patent Application No. PCT/US94/02346 (International Publication No. WO95/15258) DIAMOND COATED TOOLS AND METHOD FOR MAKING assigned to Kennametal Inc. of Latrobe, Pa.

In this regard, the application of the diamond coating, it is preferred that the substrate temperature during coating be maintained between 700° C. and 875° C. When the temperature is below about 700° C., too much graphite is formed in the diamond coating and the wear resistance is thereby significantly reduced. In addition, the rate of coating is also reduced. When the temperature is above about 875° C., too much cobalt diffuses from the substrate during coating and the adhesion of the diamond to the substrate is adversely affected. It has been found to be more preferable to perform diamond coating at about 750° C. to about 850° C.

The presence of the increased surface roughness of the first substrate region leads to an increase in the adherence of the diamond coating to the first substrate region over the adherence of the diamond coating to the second substrate region. As mentioned earlier herein, the first substrate region defines the critical impingement surfaces of the twist drill. By the diamond coating having its greatest adherence to the surface areas of the first substrate region, the twist drill will perform at an efficiency that is essentially the same as a twist drill having an increased adherence over its entire surface. Yet, because the substrate has sufficient mass (or dimensional simplicity) to resist dimensional deformation during resintering at a temperature equal to or above the liquidus, the critical cutting surfaces of the twist drill have dimensional integrity.

Applicant considers there to be a second method of carrying out the invention. In this regard, the method starts with a substrate like that depicted in FIG. 1, i.e., a surface ground cylindrical blank. The next basic step comprises the removal of material from selected portions of the generally cylindrical substrate so that the substrate is in the condition like that depicted in FIG. 2. Like for the first method, the grinding step removes a volume of material from the axially forward portion of the substrate so as to define the outside diameter of the smaller diameter part of the substrate that will become the fluted section of the twist drill. This step leaves the rearward portion of the substrate unground so as to define a larger-diameter part of the substrate that will become the shank of the twist drill.

This processing step also grinds (or removes) material from the axially forward portion of the substrate so as to define a part of the axially forward cutting surface. This step defines the cutting edge and the flank surfaces of the twist drill. The surfaces like surfaces 30 and 32 of the first embodiment are also exposed as a result of this processing step that forms the cutting edge.

The next step in the processing of the elongate structure is to remove material from the axially forward end thereof so as to produce a structure like that depicted in FIG. 3. The removal of the material through this second grinding step defines the short flutes of the twist drill. The drill should now look like the structure depicted in FIG. 3.

It is at this stage of the processing that the substrate is subjected to a resintering process. Like for the embodiment of FIG. 3, the substrate has sufficient mass (or dimensional simplicity) to withstand any tendency to suffer dimensional deformation due to the resintering, i.e., heat treating, process that takes place at a temperature above the liquidus of the material. Thus, the dimensional tolerances present in the substrate will not change, and the structure which has been ground to a desired dimension will maintain its dimensional integrity. In other words, the cutting edges, the flank surfaces, the short flutes, and the outside diameter of the fluted section (which will become the fluted lands) will keep their dimensional integrity after the resintering process. For other rotary cutting members, the critical impingement surfaces would be ground (or defined) prior to resintering so as to maximize the body mass during resintering.

After the completion of the resintering step, the surface roughness of the twist drill substrate is at least 25 microinches, $R_a$, preferably at least 35 microinches, $R_a$, and most preferably at least 40 microinches, $R_a$. The microstructure at the surface of the resintered substrate is like that of the first embodiment after resintering. The surface microstructure includes a grain size that is larger than the bulk, a cobalt content greater than that of the bulk, and no interconnected porosity.

The next step is to diamond coat the resintered substrate. The diamond coating operation is like that for the first method so that a detailed description is not necessary. The end result of the diamond coating step is a diamond-coated substrate with the critical impingement surface already ground and coated with diamond. The non-critical impingement surfaces have not yet been ground.

After completion of the diamond coating step, material is removed from the substrate so as to define the non-critical impingement surfaces, i.e., the flutes, of the twist drill. The end result of this step is a twist drill that has a critical impingement surface with diamond coating thereon and a non-critical impingement surface which has been ground so as to remove the diamond coating.

As an optional step, prior to the deposition of the diamond coating, the surfaces that correspond to the non-critical impingement surfaces are masked so that the diamond coating is not deposited thereon. One advantage associated with this option is that the diamond coating does not interfere with the removal of the material to define the non-critical impingement surfaces. More specifically, the absence of a diamond coating mat allow for the easier removal of the material without an increased chance for diamond contamination of other surface areas.

Referring to the critical impingement surface, such a surface has a surface roughness that provides for an excellent adherence of the diamond coating. In addition, the critical impingement surface has a cobalt content that is greater than that of the bulk cobalt content.

The non-critical impingement surface presents an as-ground surface. The cobalt content and the tungsten carbide grain size at the non-critical impingement surface is substantially the same as that of the bulk since the depth of grinding exceeded the depth of the surface microstructure present after the resintering.

Although the non-critical impingement surface does not have a diamond coating thereon, applicant believes that the absence of such a coating does not adversely impact upon the operation of the elongate rotary cutting member. The primary reason is that the non-critical impingement surface does not perform any of the cutting, and thus, does not need to maintain its sharpness or dimensional integrity. While the non-critical impingement surface would experience wear, this surface would not be expected to wear out during the typical useful life of the rotary cutting member.

One advantage associated with the second method described above is the elimination of cobalt contamination of the critical impingement surface during the diamond coating process.

Figure 4B:
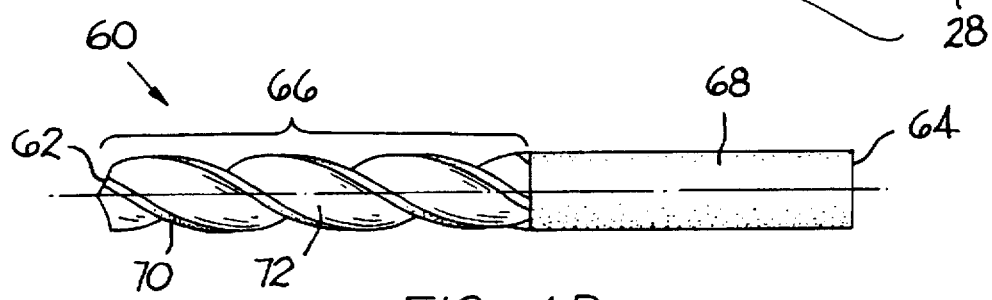
FIG. 4B is a side perspective drawing of another embodiment of a twist drill after resintering with material ground therefrom so as to define the flutes of the twist drill.

Referring to FIG. 4B of the drawings, there is shown another embodiment of a twist drill of the invention, generally designated as 60. Twist drill 60 has opposite axially forward 62 and axially rearward 64 ends. The axially forward portion 66 of the drill 60 presents flutes 72 and lands 70. The axially rearward portion of the drill comprises a shank 68. A diamond coating is on the lands, the cutting surfaces adjacent the axially forward end of the drill, and the shank. The diamond coating may have been applied by either one of the two basic methods set forth above.

It thus becomes apparent that the present invention achieves certain objects. Namely, the present invention provides an improved diamond coated elongate rotary cutting member, and a method of making the same. The present invention further provides an improved diamond coated elongate rotary cutting member that has good adherence of the diamond coating thereto, and a method of making the same. Finally, the present invention provides an improved diamond coated elongate rotary cutting member that has good adherence of the diamond coating thereto, as well as, dimensional integrity, and a method of making the same.

All patents and other documents identified herein are hereby incorporated by reference herein.

Other embodiments of the invention will be apparent to those skilled in the art from a consideration of the specification or practice of the invention disclosed herein. It is intended that the specification and examples be considered as illustrative only, with the true scope and spirit of the invention being indicated by the following claims.

What is claimed is:

1. A diamond coated elongate rotary cutting member, the cutting member including an axially forward cutting surface, a flute and a fluted land, the cutting member comprising:

a substrate, the substrate including hard grains bonded together with a metallic binder;

the substrate having a first substrate region that presents a surface, the first substrate region defines the axially forward cutting surface and the fluted land, the first substrate region containing relatively large hard grains near the surface thereof, the relatively large hard grains being larger in size than the hard grains in the interior of the substrate, the first substrate region presenting an irregular surface, and a deposited diamond coating being on the surface of the first substrate region; and the substrate having a second substrate region that defines the flute.

2. The diamond coated elongate rotary cutting member of claim 1 wherein the second substrate region containing hard grains having a size about the same as the hard grains in the interior of the substrate, the second substrate region presenting a surface that has a surface roughness less than the surface roughness of the first substrate region, the surface of the second substrate region has a diamond coating thereon, and the deposited diamond coating having an adherence to the surface of the first substrate region that is greater than its adherence to the surface of the second substrate region.

3. The diamond coated elongate rotary cutting member of claim 2 wherein the cobalt content near the surface of the first substrate region is less than the cobalt content in the interior of the substrate, and the cobalt content near the surface of the second substrate region is substantially the same as the cobalt carbide in the interior of the substrate.

4. The diamond coated elongate rotary cutting member of claim 1 wherein the hard grains of the substrate comprise one or more of tungsten carbide, titanium carbide, tantalum carbide, niobium carbide, vanadium carbide, and solid solutions thereof; the substrate comprises between about 5 weight percent and about 16 weight percent of the metallic binder; and the metallic binder is selected from the group consisting of cobalt, iron, nickel, and their alloys.

5. The diamond coated elongate rotary cutting member of claim 1 wherein the cobalt content near the surface of the first substrate region is less than the cobalt content in the interior of the substrate.

6. The diamond coated elongate rotary cutting member of claim 1 wherein the deposited diamond coating bonded to the substrate has an average thickness of between about 2 micrometers and about 100 micrometers.

7. A diamond coated rotary cutting member, the cutting member including a critical impingement surface and a non-critical impingement surface, the cutting member comprising:

a substrate, the substrate including hard grains bonded together with a metallic binder;

the substrate having a first substrate region that defines the critical impingement surface, the first substrate region containing relatively large hard grains near the critical impingement surface, the relatively large hard grains being larger in size than the hard grains in the interior of the substrate, the critical impingement surface presenting an irregular surface;

the substrate having a second substrate region that defines the non-critical impingement surface, the second substrate region containing hard grains having a size about the same as the hard grains in the interior of the substrate, the non-critical impingement surface has a surface roughness less than the surface roughness of the first substrate region; and a deposited diamond coating on the critical impingement surface.

8. The diamond coated rotary cutting member of claim 7 wherein the deposited diamond coating is on the non-critical impingement surface, and the deposited diamond coating has an adherence to the critical impingement surface that is greater than the adherence to the non-critical impingement surface.

9. The diamond coated rotary cutting member of claim 7 wherein the rotary cutting member includes an axially forward cutting edge, a flank surface, a flute and a fluted land; the critical impingement surface includes the axially forward cutting edge, the flank surface, and the fluted land; and the non-critical impingement surface includes the flute.

10. The diamond coated rotary cutting member of claim 7 wherein the cobalt content near the critical impingement surface is less than the cobalt content in the interior of the substrate, and the cobalt content near the non-critical impingement surface is substantially the same as the cobalt carbide in the interior of the substrate.

11. A method of making a diamond coated rotary cutting member wherein the cutting member includes a critical impingement surface and a non-critical impingement surface, the method comprising the steps of:

providing a sintered substrate that includes hard grains bonded together by a metallic binder;

then removing material from the substrate so as to form a first substrate region that presents the critical impingement surface;

then resintering the substrate for a time and temperature and in an atmosphere so as to produce grain growth at the surface of the substrate;

then removing material from the substrate so as to form a second substrate region that presents the non-critical impingement surface; and adherently depositing a diamond coating on the substrate wherein the adherence of the diamond coating to the critical impingement surface is greater than the adherence of the diamond coating to the non-critical impingement surface.

12. The method of claim 11 wherein the hard grains of the substrate comprise one or more of tungsten carbide, titanium carbide, tantalum carbide, niobium carbide, vanadium carbide, and solid solutions thereof; the substrate comprises between about 5 weight percent and about 16 weight percent of the metallic binder; and the metallic binder is selected from the group consisting of cobalt, iron, nickel, and their alloys.

13. The method of claim 11 wherein the cobalt content near the critical impingement surface is less than the cobalt content in the interior of the resintered substrate, and the cobalt content near the non-critical impingement surface is substantially the same as the cobalt carbide in the interior of the resintered substrate.

14. The method of claim 11 further including the step of reducing the metallic binder content at the non-critical impingement surface prior to the deposition of the diamond coating.

15. A method of making a diamond coated rotary cutting member wherein the cutting member includes a critical impingement surface and a non-critical impingement surface, the method comprising the steps of:

providing a sintered substrate that includes hard grains bonded together by a metallic binder;

then removing material from the substrate so as to form a first substrate region that presents the critical impingement surface;

then resintering the substrate for a time and temperature and in an atmosphere so as to produce grain growth at the surface of the substrate;

adherently depositing a diamond coating on the substrate; and then removing material from the diamond-coated substrate so as to form a second substrate region that presents the non-critical impingement surface wherein the critical impingement surface has a diamond coating thereon and there is an absence of diamond coating on the non-critical impingement surface.

16. The method of claim 14 wherein the critical impingement surface has a surface roughness of at least 25 microinches $R_a$.

17. The method of claim 14 wherein the diamond coating bonded to the resintered substrate has an average thickness of between about 2 micrometers and about 100 micrometers.

18. The method of claim 15 further including the step of masking the surface of the substrate that corresponds to the non-critical impingement surface prior to the deposition of the diamond coating.

* * * * *